(12) United States Patent
Chen

(10) Patent No.: US 10,741,608 B2
(45) Date of Patent: Aug. 11, 2020

(54) MANUFACTURING METHOD OF MICRO LIGHT-EMITTING DIODE DISPLAY PANEL

(71) Applicant: SHENZHEN CHINA STAR OPTOELECTRONICS TECHNOLOGY CO., LTD., Shenzhen, Guangdong (CN)

(72) Inventor: Lixuan Chen, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 118 days.

(21) Appl. No.: 16/091,250

(22) PCT Filed: Sep. 13, 2018

(86) PCT No.: PCT/CN2018/105590
§ 371 (c)(1),
(2) Date: Oct. 4, 2018

(87) PCT Pub. No.: WO2019/218551
PCT Pub. Date: Nov. 21, 2019

(65) Prior Publication Data
US 2020/0185452 A1 Jun. 11, 2020

(30) Foreign Application Priority Data
May 17, 2018 (CN) .......................... 2018 1 0474811

(51) Int. Cl.
*H01L 33/62* (2010.01)
*H01L 27/15* (2006.01)
(Continued)

(52) U.S. Cl.
CPC ........ *H01L 27/156* (2013.01); *H01L 25/0753* (2013.01); *H01L 33/50* (2013.01);
(Continued)

(58) Field of Classification Search
USPC ..... 257/13, 79–103, 918, 40, 642–643, 759; 438/22–47, 69, 493, 503, 507, 956
See application file for complete search history.

(56) References Cited

U.S. PATENT DOCUMENTS

2008/0290796 A1 11/2008 Chan et al.
2010/0078669 A1* 4/2010 Cho ........................ H01L 33/46
257/98
(Continued)

FOREIGN PATENT DOCUMENTS

CN 104752580 A 7/2015
CN 106646890 A 5/2017
(Continued)

*Primary Examiner* — Moin M Rahman
(74) *Attorney, Agent, or Firm* — Leong C. Lei

(57) ABSTRACT

The invention provides a manufacturing method of micro LED display panel, comprising: Step S1: providing a driving substrate, forming a photoresist layer on the driving substrate; Step S2: patterning the photoresist layer to form a plurality of accommodating grooves arranged in an array; Step S3: disposing a micro LED in each accommodating groove. By fabricating the photoresist layer to form the accommodating groove for accommodating the micro LED, the invention can reduce the manufacturing difficulty and improve the light emission efficiency of the micro LED.

13 Claims, 11 Drawing Sheets

(51) Int. Cl.
*H01L 33/50* (2010.01)
*H01L 25/075* (2006.01)
*H01L 33/52* (2010.01)

(52) U.S. Cl.
CPC .............. *H01L 33/52* (2013.01); *H01L 33/62* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

2014/0159064 A1* 6/2014 Sakariya ............. H01L 25/0753
257/88
2016/0380158 A1* 12/2016 Sasaki .................... H01L 24/95
257/89

FOREIGN PATENT DOCUMENTS

| CN | 106784203 A | 5/2017 |
| CN | 107221291 A | 9/2017 |
| WO | 2017107097 A1 | 6/2017 |

* cited by examiner

MANUFACTURING METHOD OF MICRO LIGHT-EMITTING DIODE DISPLAY PANEL

RELATED APPLICATIONS

The present application is a National Phase of International Application Number PCT/CN2018/105590, filed Sep. 13, 2018, and claims the priority of China Application No. 201810474811.3, filed May 17, 2018.

BACKGROUND OF THE INVENTION

1. Field of the Invention

The present invention relates to the field of display, and in particular to a manufacturing method of micro light-emitting diode (micro LED) display panel.

2. The Related Arts

With the rapid development of wearable display devices, micro-LED (uLED) technology has emerged. The micro LED technology, i.e., the LED micro-reduction and matrixing technology, refers to a high-density, micro-sized LED array that is integrated on a single chip. The power consumption of the micro LED is much lower than that of a liquid crystal display (LCD), is self-luminous like an organic light-emitting diode (OLED), and can reduce the distance between the pixels from the millimeter level to the micrometer level. Also, the color saturation is close to OLED, so many manufacturers regard micro LED as the display technology of the next generation.

The known micro LED array is fabricated by a micro transfer printing method: an LED bare chip is separated from a sapphire substrate by a laser lift-off (LLO) technique, and a patterned transfer layer is used to absorb the LED bare chip from a supply substrate and transfer to a receiving substrate. Specifically, the receiving substrate is a silicon substrate whose circuit patterns have been prepared in advance. By aligning the transfer layer with the receiving substrate, the LED bare chip absorbed on the transfer layer is attached to the matching position of the receiving substrate, and then is peeled from the transfer layer, which completes the transfer of the LED bare chip. The details of micro transfer printing technology are described in patents such as US2013/0210194, US2013/0128585.

The size of the known micro LED is much smaller than the size of the known pixel. For example, in the known 55-inch full-HD display panel, the length and width of the sub-pixels are approximately 600 μm and 200 μm, respectively, while the size of the micro LED is approximately 10 to 50 μm, which results in a large area around the micro LED not emitting light. Since the light emitted by the micro LED is directed in all directions, a greater amount of light energy is wasted in the non-display direction, and the utilization of the light is low. To solve the above problems, the prior art proposes a technical solution of fabricating a groove structure on a substrate and placing the micro LED in the groove, and using the groove to increase the light utilization rate of the micro LED, and the prior art adopts an etching method to form grooves on the substrate. However, since the height of most of the micro LEDs is currently 5 to 10 μm, etching the grooves more than 5 μm directly on the substrate is very difficult in the actual process.

SUMMARY OF THE INVENTION

The object of the present invention is to provide a manufacturing method of micro LED display panel, which is simple, the operability is high, and the manufactured LED display panel has high light output efficiency.

To achieve the above object, the present invention provides a manufacturing method of micro LED display panel, which comprises:

Step S1: providing a driving substrate, forming a photoresist layer on the driving substrate;

Step S2: patterning the photoresist layer to form a plurality of accommodating grooves arranged in an array;

Step S3: disposing a micro LED in each accommodating groove.

Preferably, the accommodating groove has a taper less than 60°.

Preferably, the photoresist layer is made of a resin material, an acrylic material, or a halogen material.

Optionally, the micro LED formed in step S3 is a vertical-structured micro LED;

in step S1, before forming the photoresist layer, further comprises a step of: forming a plurality of first pixel electrodes on the driving substrate;

each accommodating groove formed in step S2 correspondingly exposes a first pixel electrode;

after disposing the micro LED in the accommodating groove in step S3, a first electrode of the micro LED is electrically connected to the first pixel electrode;

the manufacturing method of the micro LED display panel further comprises the following steps after step S3:

forming a passivation layer on the photoresist layer, the first pixel electrode and the micro LED;

patterning the passivation layer to form a plurality of vias exposing the micro LED;

forming a plurality of second pixel electrodes arranged in an array on the passivation layer, and each second pixel electrode being electrically connected to a second electrode of the corresponding micro LED through a via;

forming a protective layer on the second pixel electrode and the passivation layer.

Optionally, the micro LED formed in step S3 is a vertical-structured micro LED;

the manufacturing method of the micro LED display panel further comprises a step between step S2 and step S3 of forming a first pixel electrode on surface of each accommodating groove; after disposing the micro LED in the accommodating groove in step S3, a first electrode of the micro LED is electrically connected to the first pixel electrode;

the manufacturing method of the micro LED display panel further comprises the following steps after step S3:

forming a passivation layer on the photoresist layer, the first pixel electrode and the micro LED;

patterning the passivation layer to form a plurality of vias exposing the micro LED;

forming a plurality of second pixel electrodes arranged in an array on the passivation layer, and each second pixel electrode being electrically connected to a second electrode of the corresponding micro LED through a via;

forming a protective layer on the second pixel electrode and the passivation layer.

Optionally, the micro LED formed in step S3 is a horizontal-structured micro LED; in step S1, before forming the photoresist layer, further comprises a step of: forming a plurality of first pixel electrodes on the driving substrate, each first pixel electrode comprising a first connection terminal and a second connection terminal disposed spaced apart;

each accommodating groove formed in step S2 correspondingly exposes a first pixel electrode;

after disposing the micro LED in the accommodating groove in step S3, a first electrode and a second electrode of the micro LED are electrically connected to the first connection terminal and the second connection terminal respectively;

the manufacturing method of the micro LED display panel further comprises the following step after step S3: forming a protective layer on the photoresist layer, the first pixel electrode and the micro LED.

Optionally, the micro LED formed in step S3 is a horizontal-structured micro LED; the manufacturing method of the micro LED display panel further comprises a step between step S2 and step S3 of forming a plurality of first pixel electrodes on surface of each accommodating groove; each first pixel electrode comprising a first connection terminal and a second connection terminal disposed spaced apart;

after disposing the micro LED in the accommodating groove in step S3, a first electrode and a second electrode of the micro LED are electrically connected to the first connection terminal and the second connection terminal respectively;

the manufacturing method of the micro LED display panel further comprises the following step after step S3: forming a protective layer on the photoresist layer, the first pixel electrode and the micro LED.

Preferably, the step of forming the second pixel electrode and the step of forming the protective layer further comprises a step of forming a light conversion layer on the second pixel electrode above the micro LED.

Preferably, after forming the protective layer, the manufacturing method of the micro LED display panel further comprises the following step:

forming an adhesive layer on the protective layer, and providing a package substrate on the adhesive layer.

Preferably, in step S2, the photoresist layer is patterned by exposure and development processes;

the depth of the accommodating groove is greater than 5 μm.

The present invention provides the following advantages: the manufacturing method of the micro LED display panel of the present invention forms the accommodating grooves for accommodating the micro LED by patterning the photoresist layer, which can reduce the difficulty of the process and improve the light extraction efficiency of the micro LED.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 27:
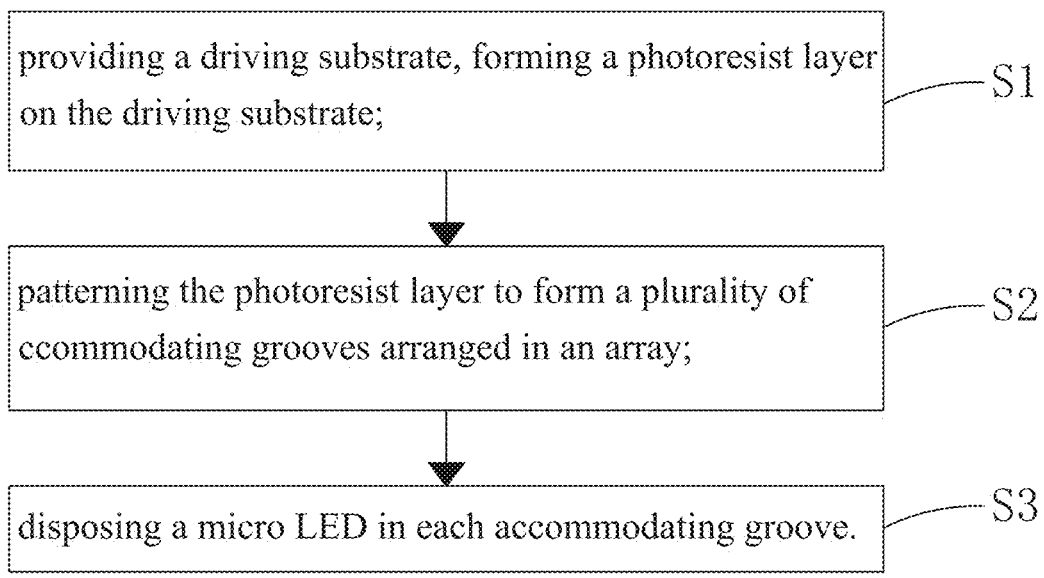
FIG. 27 is a schematic view showing the flowchart of the manufacturing method of micro LED display panel provided by the present invention.

Refer to FIG. 27. The present invention provides a manufacturing method of micro LED display panel, which comprises the flowing steps:

the present invention provides a manufacturing method of micro LED display panel, which comprises:

Step S1: providing a driving substrate 10, forming a photoresist layer 30 on the driving substrate 10;

Step S2: patterning the photoresist layer 30 to form a plurality of accommodating grooves 40 arranged in an array;

Step S3: disposing a micro LED 50 in each accommodating groove 40.

Specifically, to ensure the light extraction effect of the accommodating groove 40, the accommodating groove 40 has a taper less than 60°. The small the taper of the accommodating groove 40 is, the better the light extraction effect will be. However, in consideration of pixel size, the taper of the accommodating groove 40 cannot be reduced to an extreme.

Specifically, the present invention uses the exposure and development processes to pattern photoresist layer 30, which can easily manufacture the accommodating groove 40 with depth greater than 5 μm. Compared to the method of etching a substrate used in the prior art, the present invention fabricates a accommodating groove by exposing and developing the photoresist layer, thereby reducing the difficulty of the process and improving the light emission efficiency of the micro LED.

Preferably, the photoresist layer 30 is made of a resin material, an acrylic material, or a halogen material.

Specifically, based on different structures, the micro LED 50 can be divided into a vertical-structured micro LED and a horizontal-structured micro LED. The first and second electrodes of the vertical-structured micro LED are respectively located on the upper and lower sides of the micro LED, and both the first and second electrodes of the horizontal-structured micro LED are located on the lower side of the micro LED.

Specifically, FIGS. 1-8 are schematic views showing the manufacturing method of micro LED display panel provided by the first embodiment of the present invention. In the first embodiment, the micro LED formed in step S3 is a vertical-structured micro LED.

Figure 1:
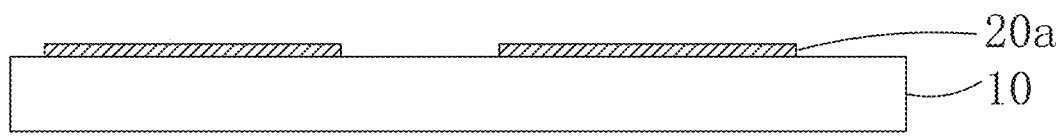
FIGS. 1-8 are schematic views showing the manufacturing method of micro LED display panel provided by the first embodiment of the present invention.
Figure 2:
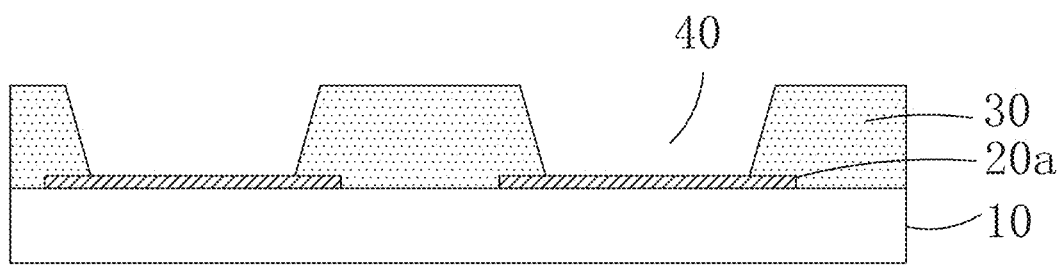
Figure 3:
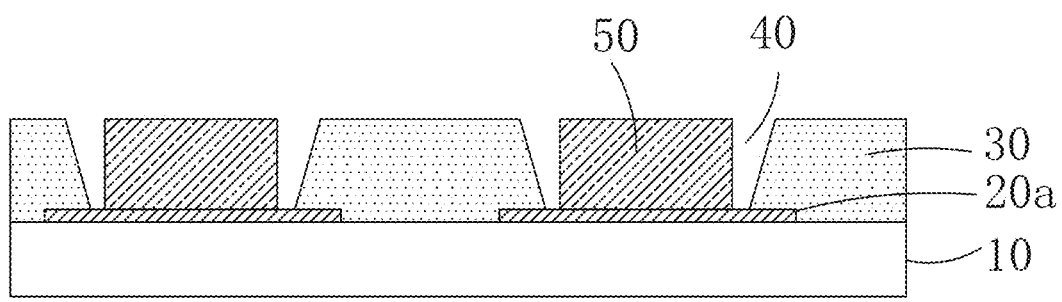
Figure 4:
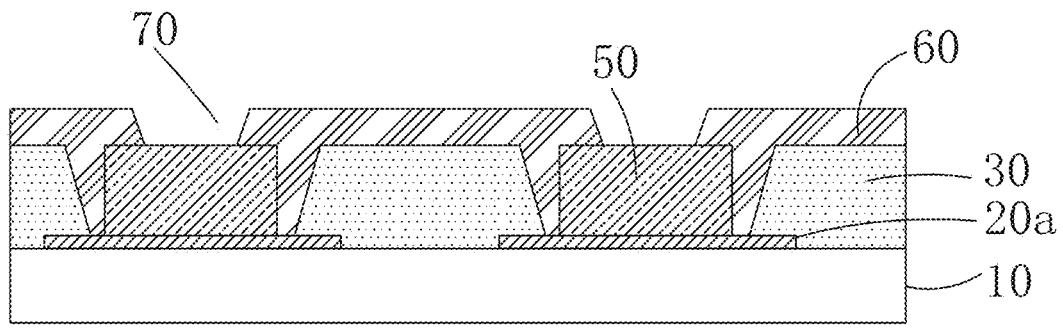
Figure 5:
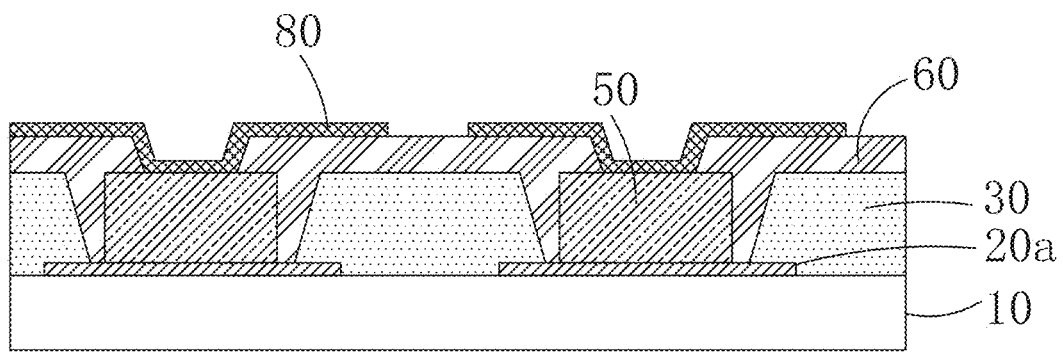
Figure 6:
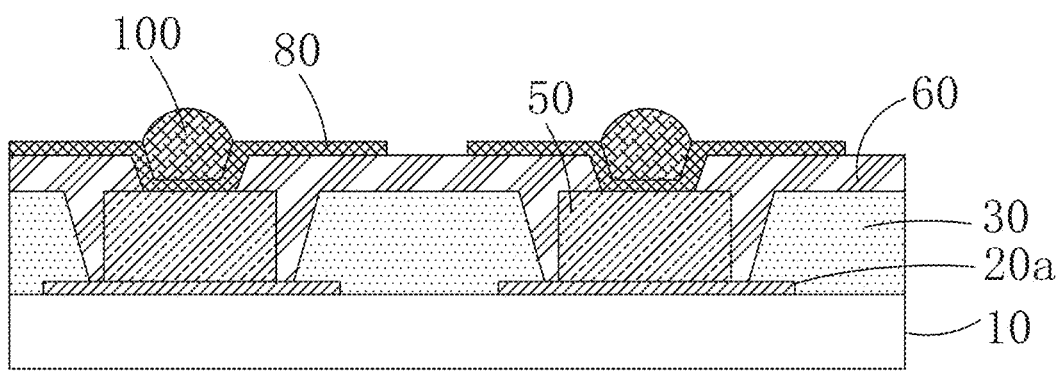
Figure 7:
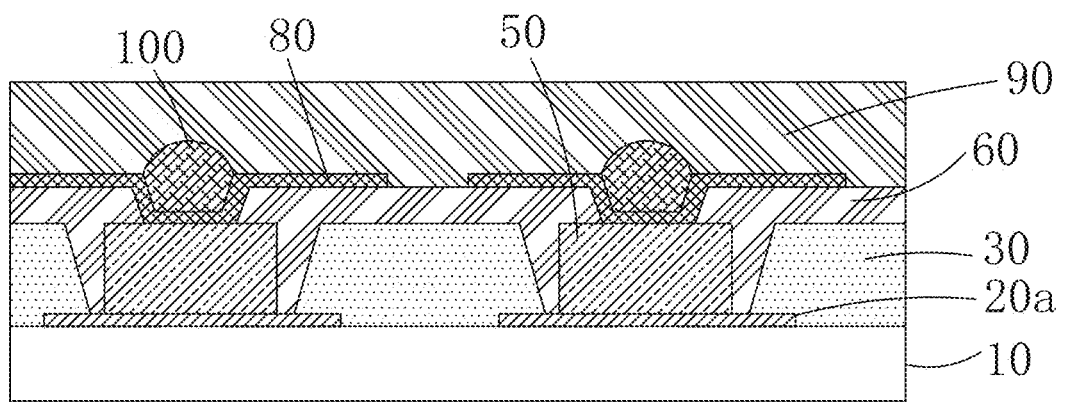
Figure 8:
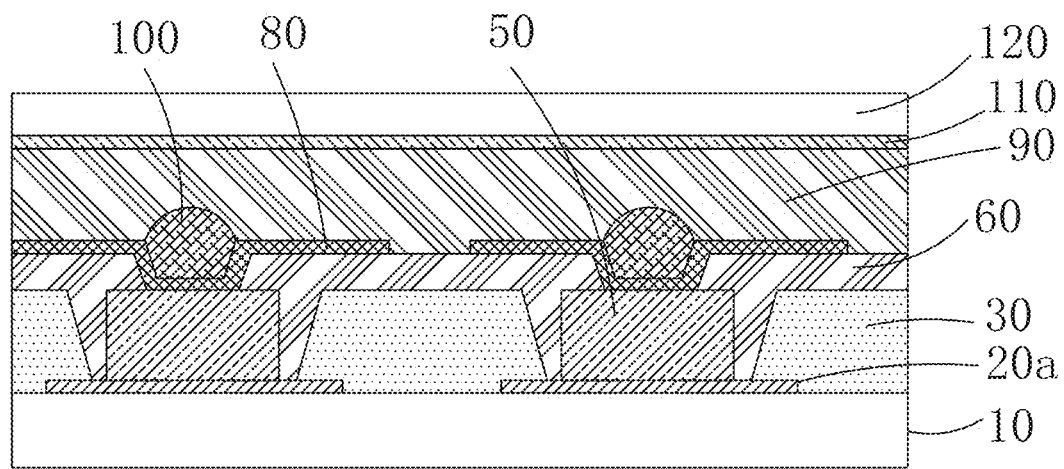

Specifically, the first embodiment comprises the following steps:

as shown in FIG. 1, forming a plurality of first pixel electrodes 20a on the driving substrate 10;

as shown in FIG. 2, then, forming and patterning a photoresist layer 30 on the driving substrate 10 and the first pixel electrode 20a to form a plurality of accommodating grooves 40 arranged in an array, each accommodating grooves 40 correspondingly exposing a first electrode pixel 20a;

as shown in FIG. 3, disposing a micro LED 50 in each accommodating groove 40, a first electrode of the micro LED is electrically connected to the first pixel electrode 20a;

as shown in FIG. 4, forming a passivation layer 60 on the photoresist layer 30, the first pixel electrode 20a and the micro LED 50;

then, patterning the passivation layer 60 to form a plurality of vias 70 exposing the micro LED 50;

as shown in FIG. 5, forming a plurality of second pixel electrodes 80 arranged in an array on the passivation layer 60, and each second pixel electrode 80 being electrically connected to a second electrode of the corresponding micro LED 50 through a via 70;

as shown in FIG. 6, forming a light conversion layer 100 on the second pixel electrode 80 above the micro LED 50.

as shown in FIG. 7, forming a protective layer 90 on the second pixel electrode 80 and the passivation layer 60.

as shown in FIG. 8, forming an adhesive layer 110 on the protective layer 90, and providing a package substrate 120 on the adhesive layer 110.

Specifically, FIGS. 9-16 are schematic views showing the manufacturing method of micro LED display panel provided by the second embodiment of the present invention. In the second embodiment, the micro LED formed in step S3 is a vertical-structured micro LED.

Figure 9:
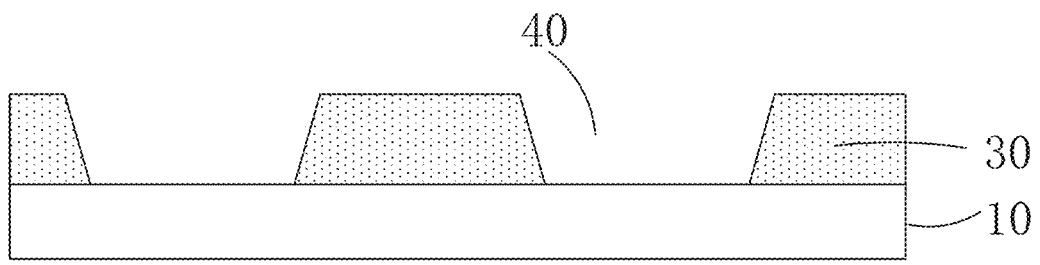
FIGS. 9-16 are schematic views showing the manufacturing method of micro LED display panel provided by the second embodiment of the present invention.
Figure 10:
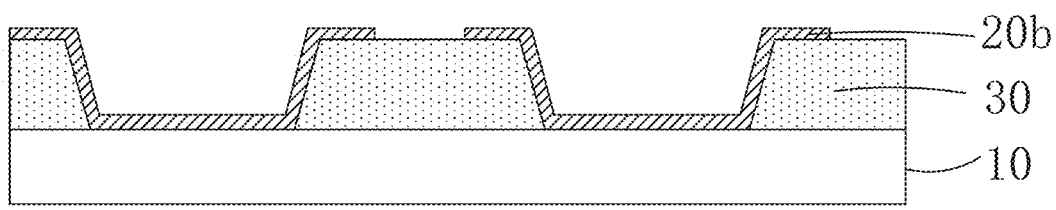
Figure 11:
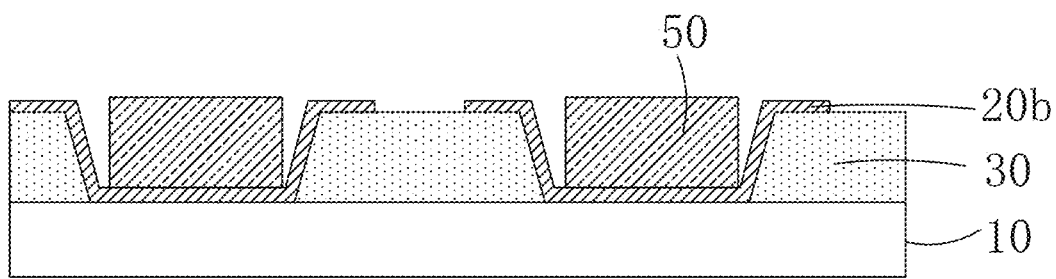
Figure 12:
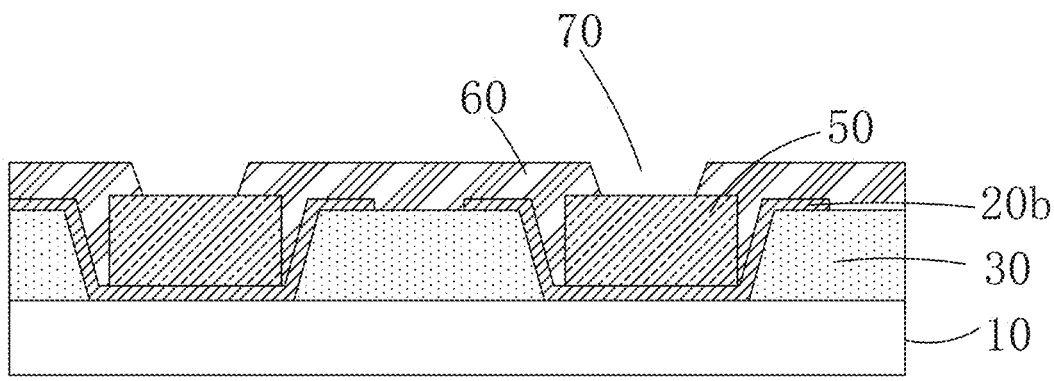
Figure 13:
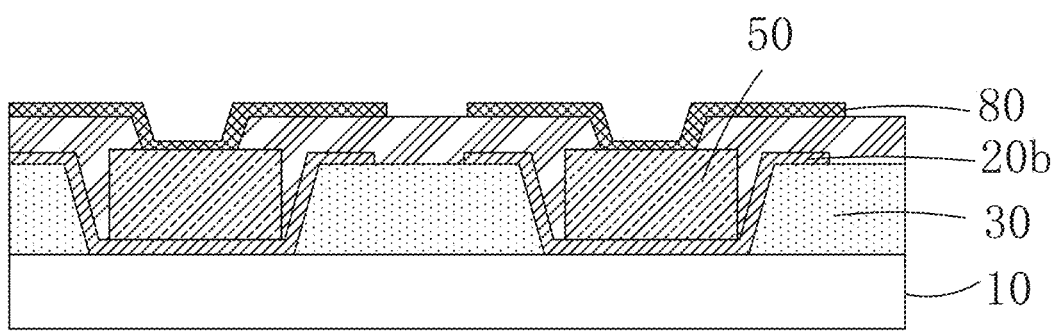
Figure 14:
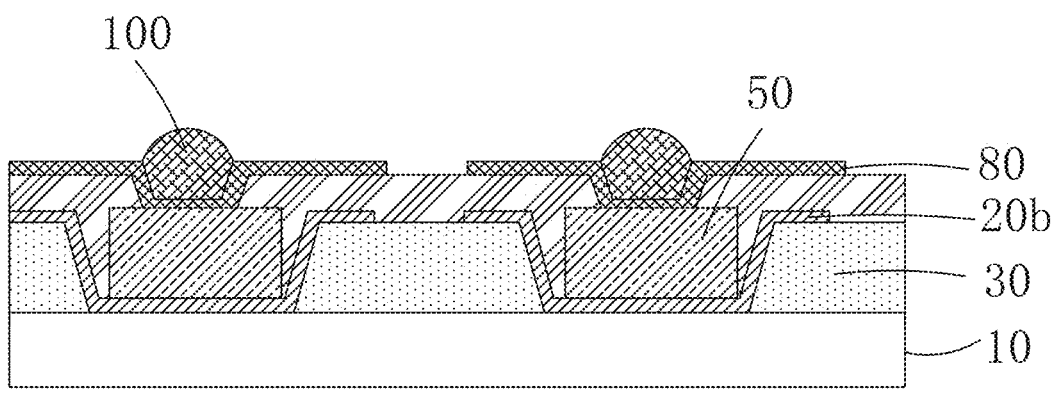
Figure 15:
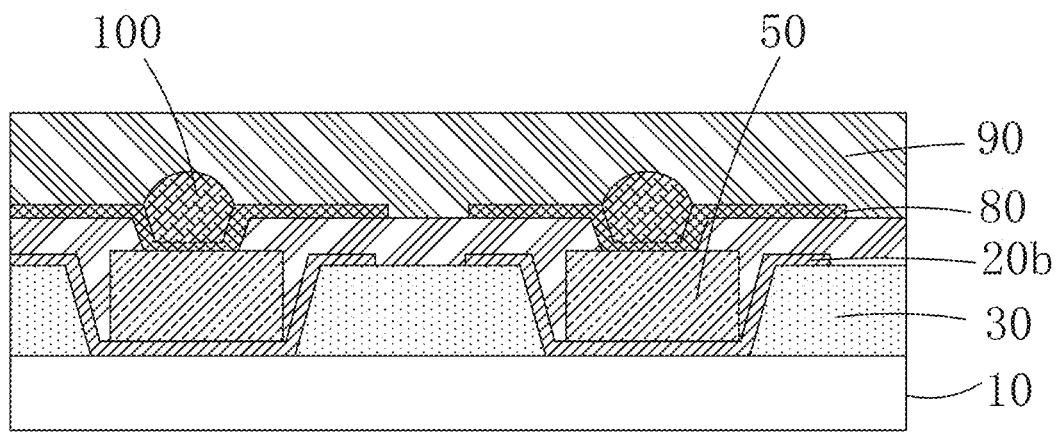
Figure 16:
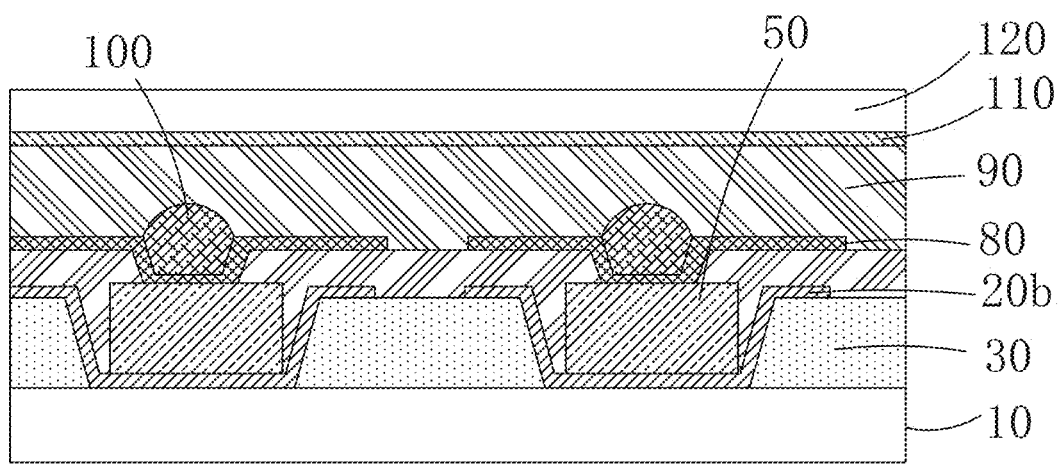

Specifically, the second embodiment comprises the following steps:

as shown in FIG. 9, forming a photoresist layer 30 on the driving substrate 10, and patterning the photoresist layer 30 to form a plurality of accommodating grooves 40 arranged in an array;

as shown in FIG. 10, forming a first pixel electrode 20b on each accommodating groove 40;

as shown in FIG. 11, disposing a micro LED 50 in each accommodating groove 40, a first electrode of the micro LED is electrically connected to the first pixel electrode 20b;

as shown in FIG. 12, forming a passivation layer 60 on the photoresist layer 30, the first pixel electrode 20b and the micro LED 50;

patterning the passivation layer 60 to form a plurality of vias 70 exposing the micro LED 50;

as shown in FIG. 13, forming a plurality of second pixel electrodes 80 arranged in an array on the passivation layer 60, and each second pixel electrode 80 being electrically connected to a second electrode of the corresponding micro LED 50 through a via 70;

as shown in FIG. 14, forming a light conversion layer 100 on the second pixel electrode 80 above the micro LED 50;

as shown in FIG. 14, forming a protective layer 90 on the second pixel electrode 80 and the passivation layer 60;

as shown in FIG. 16, forming an adhesive layer 110 on the protective layer 90, and providing a package substrate 120 on the adhesive layer 110.

It should be noted that, in the first and second embodiments of the present invention, the light conversion layer 100 may be selectively formed or not formed as required. When the light conversion layer 100 is not formed, the protective layer 90 is correspondingly filling the regions where the light conversion layer 100 may be formed. The light conversion layer 100 may be formed by a photolithography process or an inkjet printing process, and correspond to the above of the second pixel electrode 80 located in the via 70, that is, the light conversion layer 100 is in the recess created by the via 70.

It should also be noted that since the adhesion of the first pixel electrode 20b to the photoresist layer 30 is poor and needs the taper to connect to the bottom of the accommodating groove 40, the first pixel electrode 20b is easy to reflect and crack at the intersection of the taper and the flat plane. Therefore, according to the present invention, the first embodiment has better process stability than the second embodiment. However, forming the first pixel electrode 20b on the taper of the accommodating groove 40 may not improve the stability of the process, but the reflection of the accommodating groove 40 is enhanced, thereby further improving the light extraction effect of the receiving groove 40. Compared with the first embodiment, the second embodiment has better light emission rate.

Specifically, FIGS. 17-21 are schematic views showing the manufacturing method of micro LED display panel provided by the third embodiment of the present invention. In the third embodiment, the micro LED formed in step S3 is a horizontal-structured micro LED.

Figure 17:
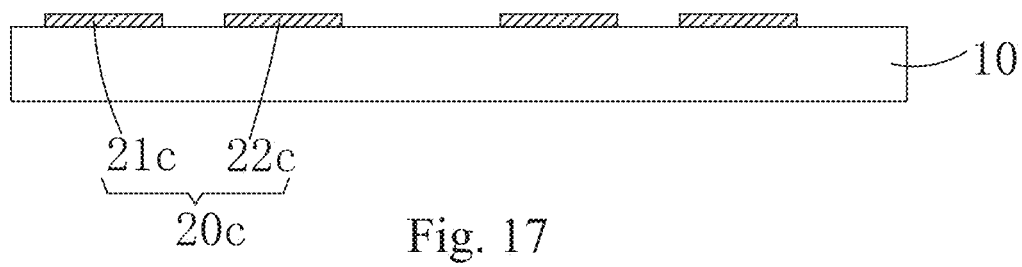
FIGS. 17-21 are schematic views showing the manufacturing method of micro LED display panel provided by the third embodiment of the present invention.
Figure 18:
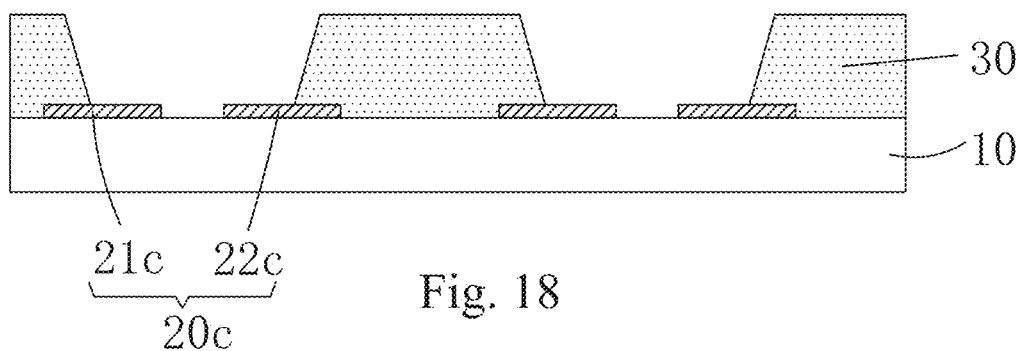
Figure 19:
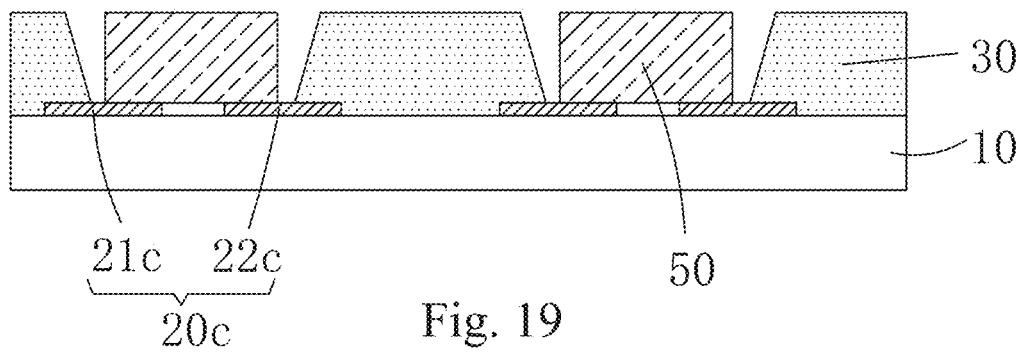
Figure 20:
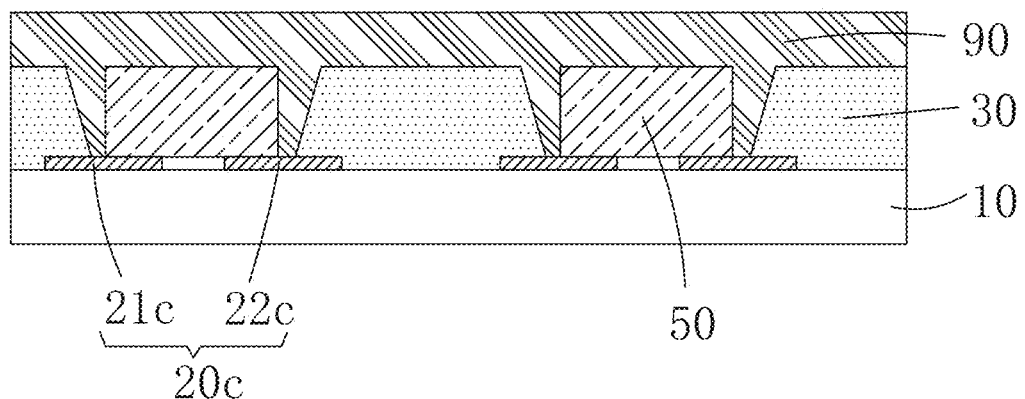
Figure 21:
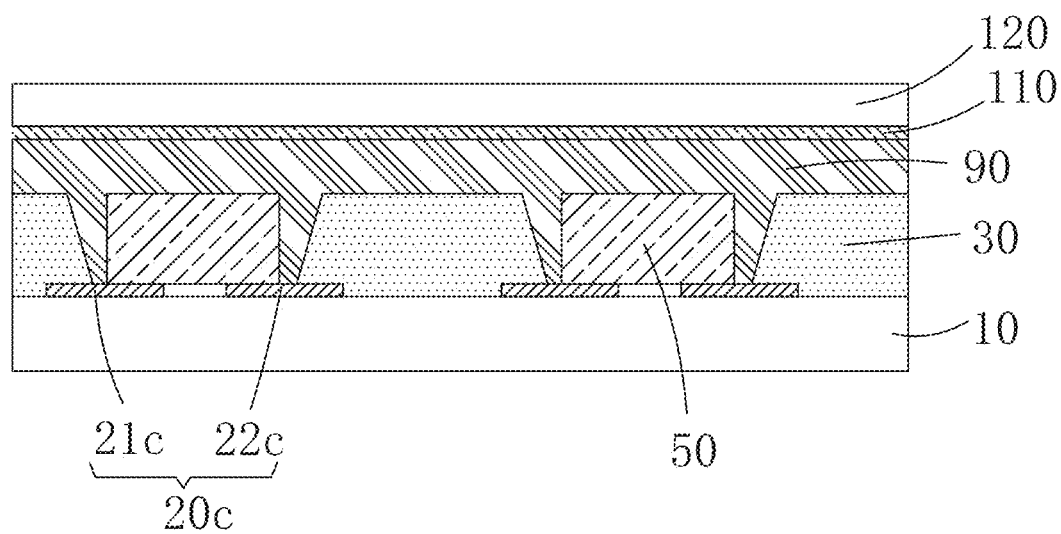

Specifically, the third embodiment comprises the following steps:

as shown in FIG. 17, forming a plurality of first pixel electrodes 20c on the driving substrate 10, each first pixel electrode 20c comprising a first connection terminal 21c and a second connection terminal 22c disposed spaced apart;

as shown in FIG. 18, then, forming a photoresist layer 30 on the driving substrate 10 and the first pixel electrode 20c and patterning the photoresist layer 30 to form a plurality of accommodating grooves 40 arranged in an array, each accommodating grooves 40 correspondingly exposing a first electrode pixel 20c;

as shown in FIG. 19, disposing a micro LED 50 in each accommodating groove 40, a first electrode and a second electrode of the micro LED 50 are electrically connected to the first connection terminal 21c and the second connection terminal 22c respectively;

as shown in FIG. 20, forming a protective layer 90 on the photoresist layer 30, the first pixel electrode 20c and the micro LED 50;

as shown in FIG. 21, forming an adhesive layer 110 on the protective layer 90, and providing a package substrate 120 on the adhesive layer 110.

Specifically, FIGS. 22-26 are schematic views showing the manufacturing method of micro LED display panel provided by the fourth embodiment of the present invention. In the fourth embodiment, the micro LED formed in step S3 is a horizontal-structured micro LED.

Figure 22:
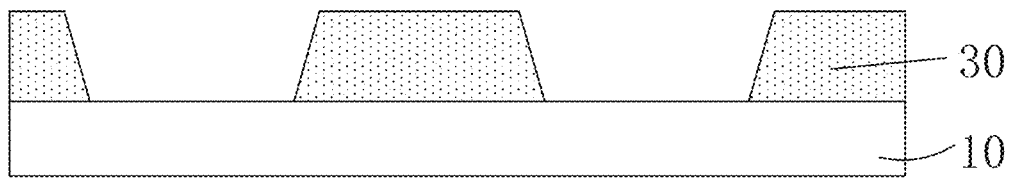
FIGS. 22-26 are schematic views showing the manufacturing method of micro LED display panel provided by the fourth embodiment of the present invention.
Figure 23:
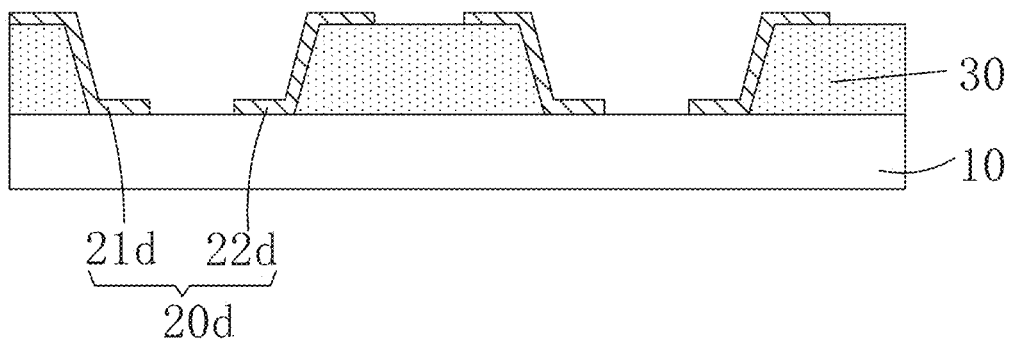
Figure 24:
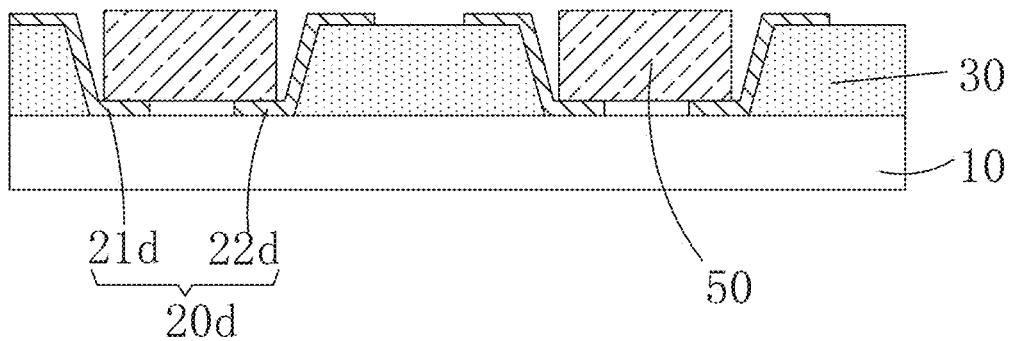
Figure 25:
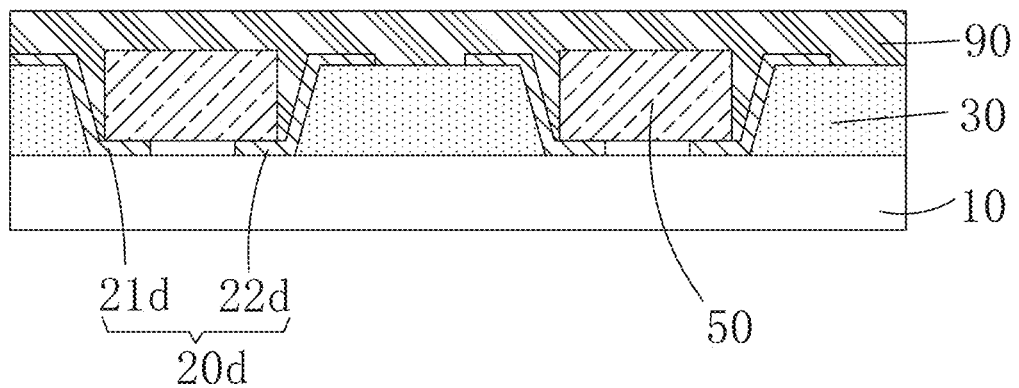
Figure 26:
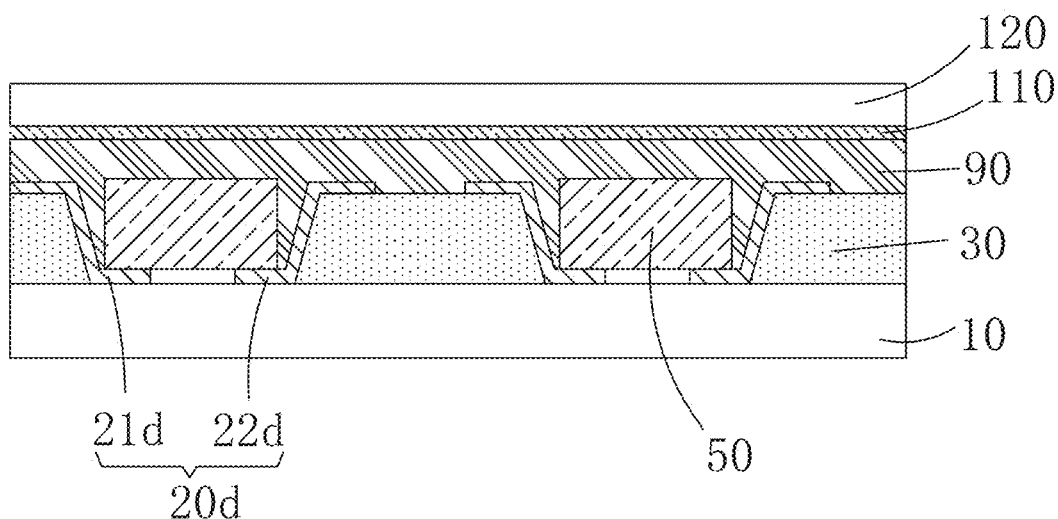

Specifically, the fourth embodiment comprises the following steps:

as shown in FIG. 22, forming a photoresist layer 30 on the driving substrate 10, and patterning the photoresist layer 30 to form a plurality of accommodating grooves 40 arranged in an array;

as shown in FIG. 23, forming a plurality of first pixel electrodes 20d on surface of each accommodating groove 40; each first pixel electrode 20d comprising a first connection terminal 21d and a second connection terminal 22d disposed spaced apart;

as shown in FIG. 24, disposing a micro LED 50 in each accommodating groove 40, a first electrode and a second electrode of the micro LED 50 are electrically connected to the first connection terminal 21d and the second connection terminal 22d respectively;

as shown in FIG. 25, forming a protective layer 90 on the photoresist layer 30, the first pixel electrode 20d and the micro LED 50;

as shown in FIG. 26, forming an adhesive layer 110 on the protective layer 90, and providing a package substrate 120 on the adhesive layer 110.

It should also be noted that since the adhesion of the first pixel electrode to the photoresist layer 30 is poor and needs the taper to connect to the bottom of the accommodating groove 40, the first pixel electrode is easy to reflect and crack at the intersection of the taper and the flat plane. Therefore, according to the present invention, the third embodiment has better process stability than the fourth embodiment. However, forming the first pixel electrode on the taper of the accommodating groove 40 may not improve the stability of the process, but the reflection of the accommodating groove 40 is enhanced, thereby further improving the light extraction effect of the receiving groove 40. Compared with the third embodiment, the fourth embodiment has better light emission rate.

Preferably, in the first to fourth embodiments of the present invention, the material of the protective layer 90 is silicon oxide, silicon nitride, or other organic insulating materials, and the adhesive layer 110 is an adhesive or a curable resin material. The curing can be thermal curing or photocuring.

In summary, the present invention provides a manufacturing method of micro LED display panel, comprising: Step S1: providing a driving substrate, forming a photoresist layer on the driving substrate; Step S2: patterning the photoresist layer to form a plurality of accommodating grooves arranged in an array; Step S3: disposing a micro LED in each accommodating groove. By fabricating the photoresist layer to form the accommodating groove for accommodating the micro LED, the present invention can reduce the manufacturing difficulty and improve the light emission efficiency of the micro LED.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of micro light-emitting diode (LED) display panel, comprising the following steps:
   Step S1: providing a driving substrate, forming a photoresist layer on the driving substrate;
   Step S2: patterning the photoresist layer to form a plurality of accommodating grooves arranged in an array;
   Step S3: disposing a micro LED in each accommodating groove;
   wherein the micro LED formed in step S3 is a vertical-structured micro LED;
   in step S1, before forming the photoresist layer, further comprises a step of: forming a plurality of first pixel electrodes on the driving substrate;
   each accommodating groove formed in step S2 correspondingly exposes a first pixel electrode;
   after disposing the micro LED in the accommodating groove in step S3, a first electrode of the micro LED is electrically connected to the first pixel electrode;
   the manufacturing method of the micro LED display panel further comprises the following steps after step S3: forming a passivation layer on the photoresist layer, the first pixel electrode and the micro LED;
   patterning the passivation layer to form a plurality of vias exposing the micro LED;
   forming a plurality of second pixel electrodes arranged in an array on the passivation layer, and each second pixel electrode being electrically connected to a second electrode of the corresponding micro LED through a via;
   forming a protective layer on the second pixel electrode and the passivation layer.

2. The manufacturing method of micro LED display panel as claimed in claim 1, wherein the accommodating groove has a taper less than 60°.

3. The manufacturing method of micro LED display panel as claimed in claim 1, wherein the photoresist layer is made of a resin material, an acrylic material, or a halogen material.

4. The manufacturing method of micro LED display panel as claimed in claim 1, wherein the micro LED formed in step S3 is a vertical-structured micro LED;
   the manufacturing method of the micro LED display panel further comprises a step between step S2 and step S3 of forming a first pixel electrode on surface of each accommodating groove; after disposing the micro LED in the accommodating groove in step S3, a first electrode of the micro LED is electrically connected to the first pixel electrode;
   the manufacturing method of the micro LED display panel further comprises the following steps after step S3:
   forming a passivation layer on the photoresist layer, the first pixel electrode and the micro LED;
   patterning the passivation layer to form a plurality of vias exposing the micro LED;
   forming a plurality of second pixel electrodes arranged in an array on the passivation layer, and each second pixel electrode being electrically connected to a second electrode of the corresponding micro LED through a via;
   forming a protective layer on the second pixel electrode and the passivation layer.

5. The manufacturing method of micro LED display panel as claimed in claim 1, wherein the micro LED formed in step S3 is a horizontal-structured micro LED; in step S1, before forming the photoresist layer, further comprises a step of: forming a plurality of first pixel electrodes on the driving substrate, each first pixel electrode comprising a first connection terminal and a second connection terminal disposed spaced apart;
   each accommodating groove formed in step S2 correspondingly exposes a first pixel electrode;
   after disposing the micro LED in the accommodating groove in step S3, a first electrode and a second electrode of the micro LED are electrically connected to the first connection terminal and the second connection terminal respectively;
   the manufacturing method of the micro LED display panel further comprises the following step after step S3: forming a protective layer on the photoresist layer, the first pixel electrode and the micro LED.

6. The manufacturing method of micro LED display panel as claimed in claim 1, wherein the micro LED formed in step S3 is a horizontal-structured micro LED; the manufacturing method of the micro LED display panel further comprises a step between step S2 and step S3 of forming a plurality of first pixel electrodes on surface of each accommodating groove; each first pixel electrode comprising a first connection terminal and a second connection terminal disposed spaced apart;

after disposing the micro LED in the accommodating groove in step S3, a first electrode and a second electrode of the micro LED are electrically connected to the first connection terminal and the second connection terminal respectively;

the manufacturing method of the micro LED display panel further comprises the following step after step S3: forming a protective layer on the photoresist layer, the first pixel electrode and the micro LED.

7. The manufacturing method of micro LED display panel as claimed in claim 1, wherein the step of forming the second pixel electrode and the step of forming the protective layer further comprises a step of forming a light conversion layer on the second pixel electrode above the micro LED.

8. The manufacturing method of micro LED display panel as claimed in claim 4, wherein the step of forming the second pixel electrode and the step of forming the protective layer further comprises a step of forming a light conversion layer on the second pixel electrode above the micro LED.

9. The manufacturing method of micro LED display panel as claimed in claim 1, wherein after forming the protective layer, the manufacturing method of the micro LED display panel further comprises the following step:

forming an adhesive layer on the protective layer, and providing a package substrate on the adhesive layer.

10. The manufacturing method of micro LED display panel as claimed in claim 4, wherein after forming the protective layer, the manufacturing method of the micro LED display panel further comprises the following step:

forming an adhesive layer on the protective layer, and providing a package substrate on the adhesive layer.

11. The manufacturing method of micro LED display panel as claimed in claim 5, wherein after forming the protective layer, the manufacturing method of the micro LED display panel further comprises the following step:

forming an adhesive layer on the protective layer, and providing a package substrate on the adhesive layer.

12. The manufacturing method of micro LED display panel as claimed in claim 6, wherein after forming the protective layer, the manufacturing method of the micro LED display panel further comprises the following step:

forming an adhesive layer on the protective layer, and providing a package substrate on the adhesive layer.

13. The manufacturing method of micro LED display panel as claimed in claim 1, wherein in step S2, the photoresist layer is patterned by exposure and development processes;

the depth of the accommodating groove is greater than 5 μm.

* * * * *